(12) United States Patent
Shih et al.

(10) Patent No.: US 8,289,080 B2
(45) Date of Patent: Oct. 16, 2012

(54) CURRENT-MODE AMPLIFIER

(75) Inventors: Horng-Yuan Shih, Taipei (TW);
Wei-Hsien Chen, Chiayi County (TW);
Kai-Cheung Juang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/855,713

(22) Filed: Aug. 13, 2010

(65) Prior Publication Data

US 2012/0019323 A1    Jan. 26, 2012

(30) Foreign Application Priority Data

Jul. 20, 2010    (TW) ................................ 99123838 A (51) Int. Cl.
*H03F 3/45*    (2006.01)
(52) U.S. Cl. ...................................................... 330/260
(58) Field of Classification Search .................... 330/86, 330/260, 258
See application file for complete search history.

(56) References Cited

U.S. PATENT DOCUMENTS

| | | | |
|---|---|---|---|
| 4,232,271 A * | 11/1980 | Dobkin et al. ................. | 330/260 |
| 5,581,212 A | 12/1996 | Huang et al. | |
| 5,900,779 A | 5/1999 | Giacomini | |
| 7,202,748 B2 | 4/2007 | Roach | |
| 7,409,198 B2 | 8/2008 | McCorkle et al. | |
| 7,482,871 B2 | 1/2009 | Lee et al. | |
| 7,504,889 B2 * | 3/2009 | Miao et al. ..................... | 330/260 |
| 7,629,906 B2 | 12/2009 | Juang et al. | |
| 7,728,667 B2 * | 6/2010 | Sugihara et al. .............. | 330/252 |
| 2007/0049234 A1 | 3/2007 | McCorkle et al. | |
| 2007/0159247 A1 | 7/2007 | Lee et al. | |

OTHER PUBLICATIONS

Nagahori et al., "An analog front-end chip set employing an electro-optical mixed design on SPICE for 5-Gb/s/ch parallel optical interconnection", IEEE Journal of Solid-State Circuits, vol. 36, pp. 1984-19991, Dec. 2001.
Hietala et al., "Two-dimensional 8×8 photoreceiver array and VCSEL drivers for high-throughput optical data links", IEEE Journal of Solid-State Circuits, vol. 36, pp. 1297-1302, Sep. 2001.
Ikeda et al., "An auto-gain control transimpedance amplifier with low noise and wide input dynamic range for 10-Gb/s optical communication systems", IEEE Journal of Solid-State Circuits, vol. 36, pp. 1303-1308, Sep. 2001.
Ruotsalainen et al., "A wide dynamic range receiver channel for a pulse time-of-flight laser radar", IEEE Journal of Solid-State Circuits, vol. 36, pp. 1228-1238, Aug. 2001.
Bin Jia, "A Low-Power Digitally-Programmable Accurate Decibel-Linear COMOS VGA for UWB Systems", EDSSC, pp. 1-4, 2008.
Soliman A. Mahmoud, "Low Voltage Current-Mode Digitally Controlled VGA Based on Digitally Programmble Current Conveyors", MWSCAS, pp. 814-817, 2008.

(Continued)

*Primary Examiner* — Khanh V Nguyen
(74) *Attorney, Agent, or Firm* — Jianq Chyun IP Office (57) ABSTRACT

A current-mode amplifier including an input stage, a feedback circuit and an output stage is provided. The input stage has an input terminal for receiving an input current of the current-mode amplifier. The input stage generates a corresponding inner current in accordance with the input current and a feedback current. The feedback circuit is connected to the input stage. The feedback circuit generates the corresponding feedback current in accordance with the inner current of the input stage. An input terminal of the output stage is connected to an output terminal of the input stage. An output terminal of the output stage serves as an output terminal of the current-mode amplifier.

19 Claims, 9 Drawing Sheets

OTHER PUBLICATIONS

Shih et al., "A 250 MHz 14 dB-NF 73 dB-Gain 82 db-DR Analog Baseband Chain With Digital-Assisted DC-Offset Calibration for Ultra-Wideband", IEEE J. Solid-State Circuits, vol. 45, No. 2, pp. 338-250, Feb. 2010.

* cited by examiner

CURRENT-MODE AMPLIFIER

CROSS-REFERENCE TO RELATED APPLICATION

This application claims the priority benefit of Taiwan application serial no. 99123838, filed on Jul. 20, 2010. The entirety of the above-mentioned patent application is hereby incorporated by reference herein and made a part of specification.

BACKGROUND

1. Field of the Disclosure

The disclosure relates to an amplifier. More particularly, the disclosure relates to a current-mode amplifier.

2. Description of Related Art

In an ultra-wideband (UWB) wireless transceiver system, signal data is transmitted by orthogonal frequency division multiplexing (OFDM). To decode the signal data at a transceiver end, during a process of reducing signal from a radio frequency (RF) to a baseband (0-240 MHz), and an operation of an analog to digital converter (ADC), a gain of the baseband must be consistent. However, in a present circuit design, a voltage-mode amplifier cannot be operated over 100 MHz. In a receiver of the UWB system, since the circuit is usually operated in a non-linear zone due to interference signals during a process of reducing the signal from the RF to the baseband, a linearity consideration is very important. In the UWB system, a variable gain amplifier must have a good linearity, an optimal direct current (DC) offset and an acceptable anti-noise function.

In a conventional IF down-conversion design, design difficulties and power consumptions of the variable gain amplifier and a filter are increased as a bandwidth thereof is increased. Also the IF down-conversion can resolve the problem of DC offset, other problems are encountered, for example, linearity and power consumption. Therefore, a direction-converter is still widely used in the UWB system. Anyway, in the present UWB system, the voltage-mode amplifier is used to implement the variable gain amplifier. An input impedance of the voltage-mode amplifier is the greater the better (which preferably approaches infinity), and an output impedance thereof is the smaller the better (which preferably approaches 0). Contrary to the voltage-mode amplifier, an input impedance of a current-mode amplifier is the smaller the better (which preferably approaches 0), and an output impedance thereof is the greater the better (which preferably approaches infinity). In the present UWB system, the current-mode amplifier is not yet used to implement the variable gain amplifier.

SUMMARY

The disclosure is directed to a current-mode amplifier, which can be used to implement a variable gain amplifier of an ultra-wideband (UWB) system.

An exemplary embodiment of the disclosure provides a current-mode amplifier including an input stage, a feedback circuit and an output stage. The input stage has an input terminal for receiving an input current of the current-mode amplifier. The input stage generates a corresponding inner current according to the input current and a feedback current of the feedback circuit. The feedback circuit is connected to the input stage. The feedback circuit generates the corresponding feedback current according to the inner current of the input stage. An input terminal of the output stage is connected to an output terminal of the input stage. An output terminal of the output stage serves as an output terminal of the current-mode amplifier.

According to the above descriptions, an exemplary embodiment of the disclosure provides a current-mode amplifier, which can be used to implement a variable gain amplifier in a UWB wireless transceiver system. A baseband signal is amplified according to a broadband property of the current-mode amplifier, so as to overcome a limitation that the voltage-mode amplifier cannot be operated over 100 MHz. In the disclosure, a gain control/change of the current-mode amplifier is achieved by controlling a current mirror, so that a problem of gain error influenced by fabrication variation can be resolved.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

An amplifier fabricated according to a complementary metal-oxide semiconductor (CMOS) process has a high voltage gain. Regarding the amplifier with a fixed current consumption, multiplication of a gain G and a bandwidth W thereof is a constant C (i.e. $G \times W = C$). Therefore, to obtain a relatively high bandwidth W and relatively high gain G, power consumption has to be increased. However, a baseband requirement of ultra-wideband (UWB) cannot be reached regardless of how greater the power consumption is, so that a method of adding a zero pole to the amplifier is used to increase the multiplication of the gain and the bandwidth.

However, when the bandwidth becomes greater (greater than 250 MHz), such method is inapplicable.

A conventional analog baseband circuit structure generally uses a voltage-mode transmission approach without using a current-mode transmission approach. Regarding a broadband system, the smaller a load resistance is, the wider an operation bandwidth is, and the smaller the load resistance is, the better effect the current transmission is. Such characteristic avails applying a current-mode amplifier to a present or a future UWB system.

Figure 1:
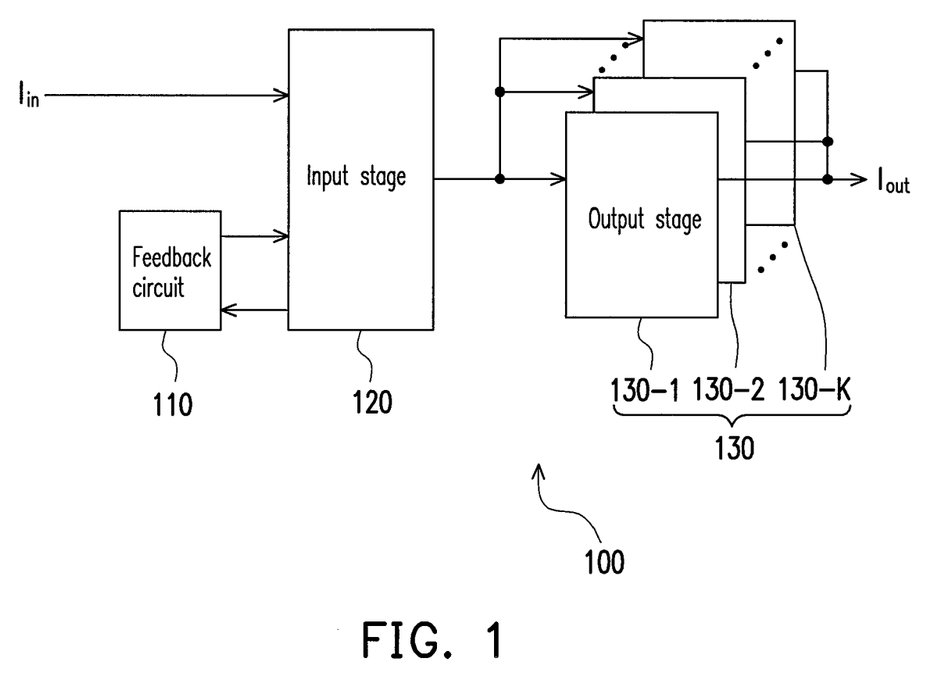
FIG. 1 is a functional block diagram illustrating a current-mode amplifier according to an exemplary embodiment of the disclosure.

FIG. 1 is a functional block diagram illustrating a current-mode amplifier 100 according to an exemplary embodiment of the disclosure. As shown in FIG. 1, the current-mode amplifier 100 includes a feedback circuit 110, an input stage 120 and an output stage 130. The input stage 120 has an input terminal for receiving an input current $I_{in}$ of the current-mode amplifier 100. The input stage 120 generates a corresponding inner current according to the input current $I_{in}$ and a feedback current of the feedback circuit 110. The input stage 120 may use a common gate complementary metal-oxide semiconductor (CMOS) amplifier in collaboration with the feedback circuit 110 to achieve an effect of reducing an input impedance. In other exemplary embodiment, the input stage 120 may use a common base bipolar junction transistor (BJT) amplifier in collaboration with the feedback circuit 110 to achieve the effect of reducing the input impedance.

The feedback circuit 110 is connected to the input stage 120. The feedback circuit 110 generates the corresponding feedback current according to the inner current of the input stage 120. In some exemplary embodiments, the feedback circuit 110 can be a trans-impedance amplifier (TIA). A relationship of the inner current, the input current $I_{in}$ and the feedback current is determined according to a design requirement. For example, the inner circuit is a sum of the input current $I_{in}$ and the feedback current. The feedback circuit 110 may reduce the input impedance of the input stage 120, so as to achieve a purpose of broadband.

An input terminal of the output stage 130 is connected to an output terminal of the input stage 120. An output terminal of the output stage 130 serves as an output terminal of the current-mode amplifier 100. The output stage 130 generates a corresponding output current $I_{out}$ according to the inner current of the input stage 120. The output stage 130 has one or a plurality of gain circuits, for example, K gain circuits 130-1, 130-2, ..., 130-K shown in FIG. 1. According to a gain requirement, each of the gain circuits 130-1~130-K can enable a part of the gain circuits by controlling a bias voltage thereof, and disable the other gain circuits. By enabling and disabling the gain circuits 130-1~130-K, a gain of the current-mode amplifier 100 is adjusted, so as to achieve a variable gain effect.

Figure 2:
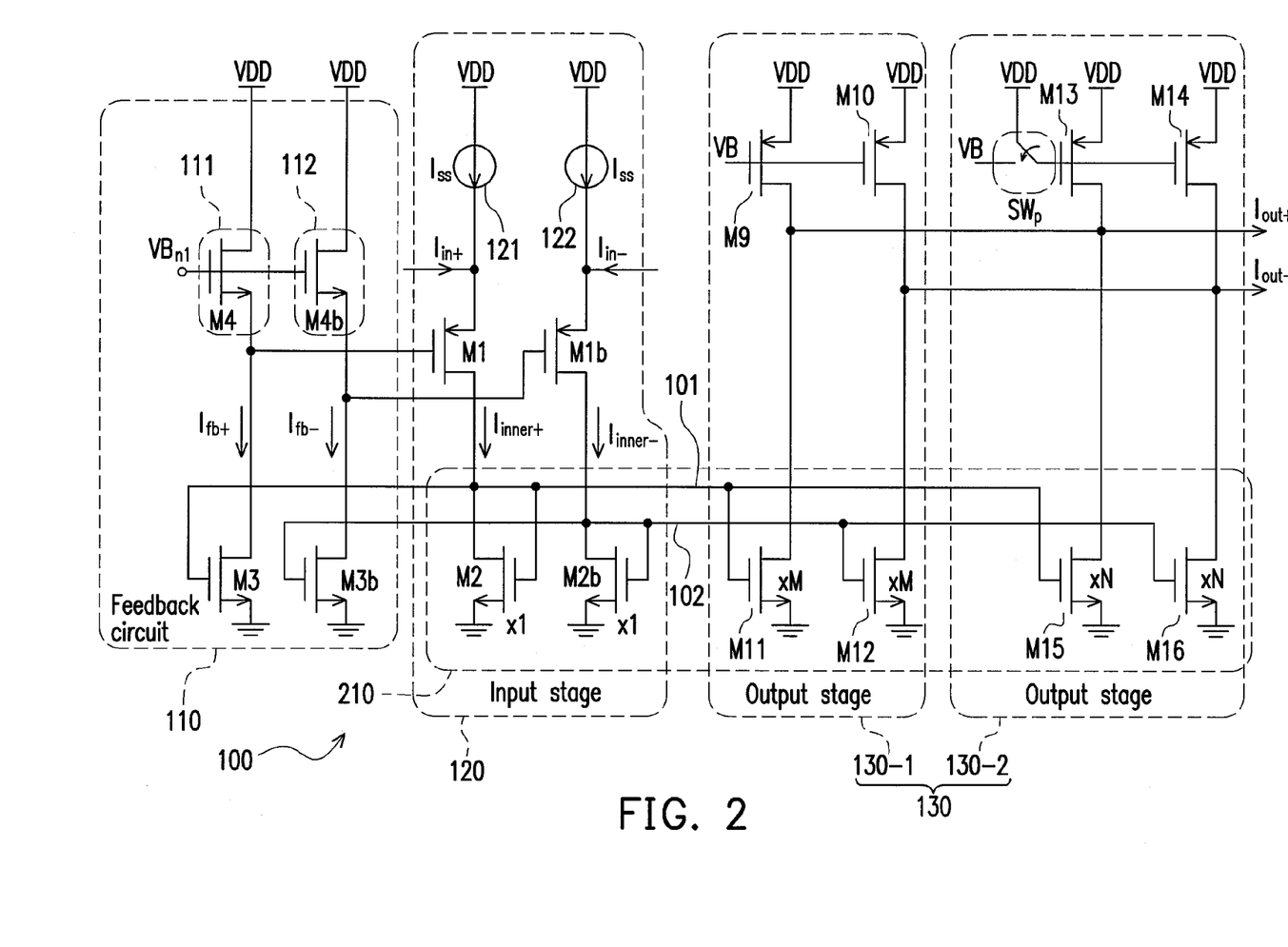
FIG. 2 is a circuit schematic diagram of a current-mode amplifier of FIG. 1 according to an exemplary embodiment of the disclosure.

FIG. 2 is a circuit schematic diagram of the current-mode amplifier 100 of FIG. 1 according to an exemplary embodiment of the disclosure. In the present exemplary embodiment, the input current $I_{in}$ includes a first input current $I_{in+}$ and a second input current $I_{in-}$, and the output current $I_{out}$ includes a first output current $I_{out+}$ and a second output current $I_{out-}$. In FIG. 2, two gain circuits 130-1 and 130-2 connected in parallel are used to implement the output stage 130, though a number of the gain circuits can be determined according to an actual design requirement. For example, the gain circuit 130-2 can be omitted, or more gain circuit 130-2 can be applied.

The input terminal of the input stage 120 includes a first input terminal used for receiving the first input current $I_{in+}$ and a second input terminal used for receiving the second input current $I_{in-}$. The output terminal of the input stage 120 include a first output terminal used for providing a first inner signal 101 and a second output terminal used for providing a second inner signal 102. Based on a current mirror structure 210, the input stage 120 may convert a first inner current $I_{inner+}$ and a second inner current $I_{inner-}$ into the corresponding first inner signal 101 and the second inner signal 102. The output stage 130 can mirror the inner currents $I_{inner+}$ and $I_{inner-}$ of the input stage 120 to internal of the output stage 130 according to the first inner signal 101 and the second inner signal 102.

The input stage 120 includes a first current source 121, a second current source 122, a first transistor M1, a second transistor M1b, a third transistor M2 and a fourth transistor M2b. A first end of the first current source 121 is connected to a first end (for example, a source) of the first transistor M1, a second end of the first current source 121 is connected to a first reference voltage (for example, a power voltage VDD). The first end of the first transistor M1 is further connected to the first input terminal of the input stage 120, so that the first end of the first transistor M1 may receive a current Iss of the first current source 121 and the first input current $I_{in+}$ of the input stage 120. A first end of the second current source 122 is connected to a first end (for example, a source) of the second transistor M1b, and a second end of the second current source 122 is connected to the first reference voltage. The first end of the second transistor M1b is further connected to the second input terminal of the input stage 120, so that the first end of the second transistor M1b may receive the current Iss of the second current source 122 and the second input current $I_{in-}$ of the input stage 120.

Control ends (for example, gates) of the first transistor M1 and the second transistor M1b are controlled by the feedback circuit 110. A second end (for example, a drain) of the first transistor M1 is connected to a first end (for example, a drain) of the third transistor M2. A control end (for example, a gate) of the third transistor M2 is connected to the first end of the third transistor M2. A common node of the third transistor M2 and the first transistor M1 is connected to the first output terminal of the input stage 120 for providing the first inner signal 101. A second end (for example, a drain) of the second transistor M1b is connected to a first end (for example, a drain) of the fourth transistor M2b. A control end (for example, a gate) of the fourth transistor M2b is connected to the first end of the fourth transistor M2b. A common node of the fourth transistor M2b and the second transistor M1b is connected to the second output terminal of the input stage 120 for providing the second inner signal 102. Second ends (for example, sources) of the third transistor M2 and the fourth transistor M2b are connected to a second reference voltage (for example, a ground voltage).

In the present exemplary embodiment, the first transistor M1 and the second transistor M1b are P-channel metal oxide semiconductor (PMOS) transistors, and the third transistor M2 and the fourth transistor M2b are N-channel metal oxide semiconductor (NMOS) transistors.

The feedback circuit 110 includes a first impedance 111, a second impedance 112, a fifth transistor M3 and a sixth transistor M3b. The first impedance 111 and the second impedance 112 can be impedance devices such as resistors, transistors, or diodes, etc. In the present exemplary embodiment, the first impedance 111 includes a seventh transistor M4, and the second impedance 112 includes an eighth transistor M4b. In the present exemplary embodiment, the fifth transistor M3, the sixth transistor M3B, the seventh transistor M4 and the eighth transistor M4b are NMOS transistors.

A first end (for example, a drain) of the seventh transistor M4 is connected to the first reference voltage, and a second end (for example, a source) of the seventh transistor M4 is connected to the control end of the first transistor M1. A first end (for example, a drain) of the fifth transistor M3 is connected to the second end of the seventh transistor M4, a second end (for example, a source) of the fifth transistor M3 is connected to the second reference voltage, and a control end (for example, a gate) of the fifth transistor M3 is connected to the first end of the third transistor M2. The third transistor M2 and the fifth transistor M3 form a current mirror, so that the feedback circuit 110 can generate a corresponding feedback current $I_{fb+}$ according to the inner current $I_{inner+}$ of the input stage 120. The seventh transistor M4 may convert the feedback current $I_{fb+}$ into a corresponding control voltage to control the first transistor M1, so as to reduce the input impedance of the input stage 120 and achieve the purpose of broadband. By adjusting a bias $VB_{n1}$, a gain of the feedback current $I_{fb+}$ can be changed. In the present exemplary embodiment, a relationship of the inner current $I_{inner+}$, the input current $I_{in+}$ and the feedback current $I_{fb+}$ is $I_{inner+} = I_{in+} + I_{fb+}$.

A first end (for example, a drain) of the eighth transistor M4b is connected to the first reference voltage, and a second end (for example, a source) of the eighth transistor M4b is connected to the control end of the second transistor M1b. A first end (for example, a drain) of the sixth transistor M3b is connected to the second end of the eighth transistor M4b, a second end (for example, a source) of the sixth transistor M3b is connected to the second reference voltage, and a control end (for example, a gate) of the sixth transistor M4b is connected to the first end of the fourth transistor M2b. The fourth transistor M2b and the sixth transistor M3b form a current mirror, so that the feedback circuit 110 can generate a corresponding feedback current $I_{fb-}$ according to the inner current $I_{inner-}$ of the input stage 120. The eighth transistor M4b may convert the feedback current $I_{fb-}$ into a corresponding control voltage to control the second transistor M1b, so as to reduce the input impedance of the input stage 120 and achieve the purpose of broadband. By adjusting the bias $VB_{n1}$, a gain of the feedback current $I_{fb-}$ can be changed. In the present exemplary embodiment, a relationship of the inner current $I_{inner-}$, the input current $I_{in-}$ and the feedback current $I_{fb-}$ is $I_{inner-} = I_{in-} + I_{fb-}$.

The input terminal of the output stage 130 includes a first input terminal used for receiving the first inner signal 101 and a second input terminal used for receiving the second inner signal 102, and the output terminal of the output stage 130 includes a first output terminal used for providing the first output current $I_{out+}$ and a second output terminal used for providing the second output current $I_{out-}$. The gain circuit 130-1 of the output stage 130 includes a ninth transistor M9, a tenth transistor M10, an eleventh transistor M11 and a twelfth transistor M12. In the present exemplary embodiment, the ninth transistor M9 and the tenth transistor M10 are PMOS transistors, and the eleventh transistor M11 and the twelfth transistor M12 are NMOS transistors. A first end (for example, a drain) of the ninth transistor M9 is connected to the first output terminal of the output stage 130, and a control end (for example, a gate) of the ninth transistor M9 receives a first bias VB. A first end (for example, a drain) of the tenth transistor M10 is connected to the second output terminal of the output stage 130, and a control end (for example, a gate) of the tenth transistor M10 receives the first bias VB. Second ends (for example, sources) of the transistors M9 and M10 are connected to the first reference voltage (for example, the power voltage VDD).

A first end (for example, a drain) of the eleventh transistor M11 is connected to the first end of the ninth transistor M9, and a control end (for example, a gate) of the eleventh transistor M11 is connected to the first input terminal of the output stage 130 for receiving the first inner signal 101. A first end (for example, a drain) of the twelfth transistor M12 is connected to the first end of the tenth transistor M10, and a control end (for example, a gate) of the twelfth transistor M12 is connected to the second input terminal of the output stage 130 for receiving the second inner signal 102. Second ends (for example, sources) of the transistors M11 and M12 are connected to the second reference voltage (for example, the ground voltage).

The gain circuit 130-2 of the output stage 130 includes a first switch SWp, a thirteenth transistor M13, a fourteenth transistor M14, a fifteenth transistor M15 and a sixteenth transistor M16. In the present exemplary embodiment, the thirteenth transistor M13 and the fourteenth transistor M14 are PMOS transistors, and the fifteenth transistor M15 and the sixteenth transistor M16 are NMOS transistors. A first end (for example, a drain) of the thirteenth transistor M13 is connected to the first output terminal of the output stage 130. A first end (for example, a drain) of the fourteenth transistor M14 is connected to the second output terminal of the output stage 130. Second ends (for example, sources) of the transistors M13 and M14 are connected to the first reference voltage (for example, the power voltage VDD).

A first end (for example, a drain) of the fifteenth transistor M15 is connected to the first end of the thirteenth transistor M13, and a control end (for example, a gate) of the fifteenth transistor M15 is connected to the first input terminal of the output stage 130 for receiving the first inner signal 101. A first end (for example, a drain) of the sixteenth transistor M16 is connected to the first end of the fourteenth transistor M14, and a control end (for example, a gate) of the sixteenth transistor M16 is connected to the second input terminal of the output stage 130 for receiving the second inner signal 102. Second ends (for example, sources) of the transistors M15 and M16 are connected to the second reference voltage (for example, the ground voltage).

The first bias VB or the first reference voltage (for example, the power voltage VDD) can be selected and transmitted to the control ends (the gates) of the thirteenth transistor M13 and the fourteenth transistor M14 through the first switch SWp. When the first bias VB is selected and transmitted to the control ends of the transistors M13 and M14 through the first switch SWp, a circuit structure of the gain circuit 130-2 is similar to that of the gain circuit 130-1. The transistors M2, M2b, M11, M12, M15 and M16 form the current mirror structure 210. The transistors M2, M11 and M16 form a current mirror, wherein channel aspect ratios (or channel width/length ratios W/L) of the transistors M2, M11 and M15 are 1:M:N. According to the first inner signal 101, the gain circuits 130-1 and the 130-2 can respectively mirror the inner current $I_{inner+}$ to internals of the gain circuits 130-1 and 130-2 by multiplication factors of M and N. The transistors M2b, M12 and M16 form another current mirror, wherein channel aspect ratios (or channel width/length ratios W/L) of the transistors M2b, M12 and M16 are 1:M:N. According to the second inner signal 102, the gain circuits 130-1 and the 130-2 can respectively mirror the inner current $I_{inner-}$ to internals of the gain circuits 130-1 and 130-2 by multiplication factors of M and N. By determining the proportional relation of 1:M:N, current gains of the gain circuits 130-1 and 130-2 can be set. Now, the gain circuits 130-1 and 130-2 commonly provide the first output current $I_{out+}$ and the second output current $I_{out-}$.

When the power voltage VDD is selected and transmitted to the control ends of the transistors M13 and M14 through the first switch SWp, the transistors M13 and M14 are turned off, which is equivalent to a situation that the gain circuit 130-2 is disabled. Now, the first output current $I_{out+}$ and the second output current $I_{out-}$ are provided by the gain circuit 130-1 alone. Therefore, by controlling the first switch SWp, the gain of the current-mode amplifier 100 can be changed, so as to achieve an effect of a variable gain amplifier (VGA).

Figure 3:
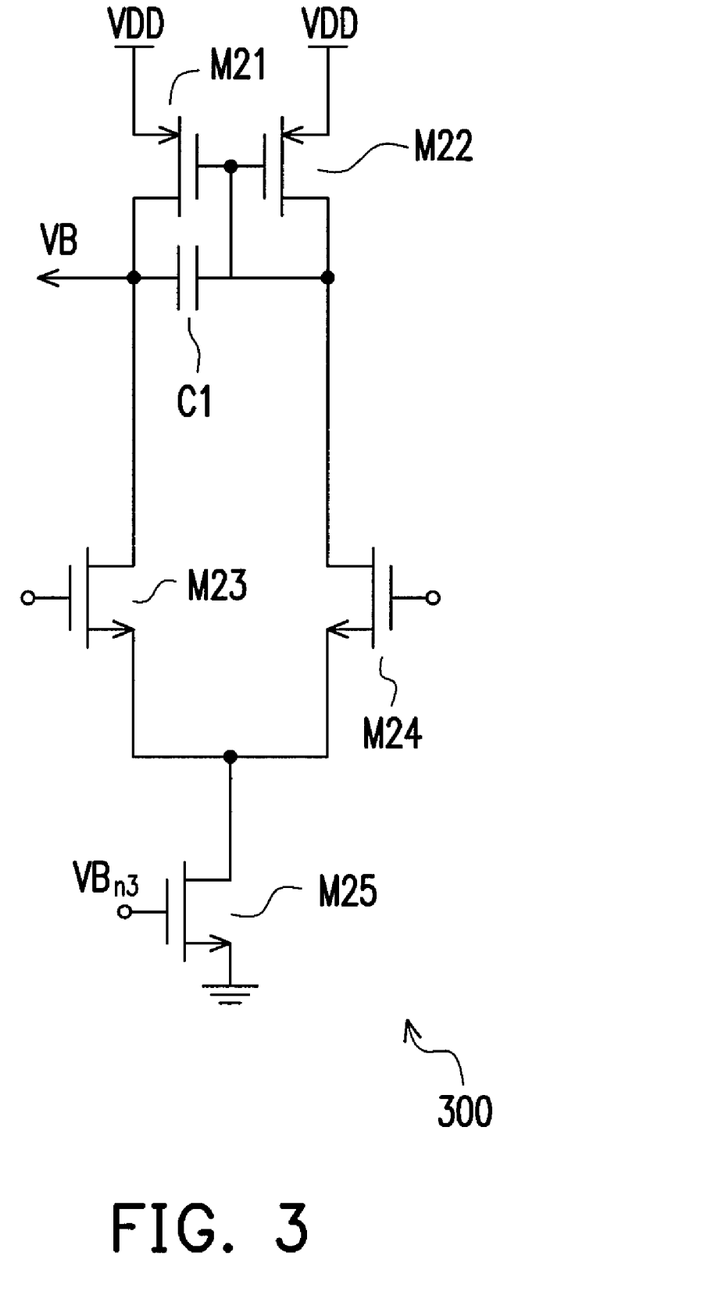
FIG. 3 is a circuit schematic diagram illustrating a common-mode feedback amplifier according to an exemplary embodiment of the disclosure.

The first bias VB is determined according to an actual design requirement. For example, the first bias VB can be a band-gap reference voltage or a common-mode feedback (CMFB) voltage. FIG. 3 is a circuit schematic diagram illustrating a common-mode feedback amplifier 300 according to an exemplary embodiment of the disclosure. The common-mode feedback amplifier 300 includes a PMOS transistor M21, a PMOS transistor M22, an NMOS transistor M23, an NMOS transistor M24, an NMOS transistor M25 and a capacitor C1. Sources of the transistors M21 and M22 are connected to the power voltage VDD. Gates of the transistors M21 and M22 are connected to a drain of the transistor M22, a drain of the transistor M24 and a first end of the capacitor C1. A drain of the transistor M21 is connected to a drain of the transistor M23 and a second end of the capacitor C1, and outputs the first bias VB to the output stage 130. A drain of the transistor M25 is connected to sources of the transistors M23 and M24, and a source of the transistor M25 is connected to the ground. Gates of the transistors M23 and M24 respectively receive a common-mode voltage and a feedback voltage of the system. A gate of the transistor M25 is connected to a bias $VB_{n3}$. The bias $VB_{n3}$ can be a band-gap reference voltage or other fixed voltages.

In the above exemplary embodiment, a broadband gain variable current-mode amplifier structure is introduced. Such structure can be widely applied to various wireless/cable broadband systems, and can be used to implement an analog baseband circuit in the broadband system for adjusting strength of a received signal.

Figure 4:
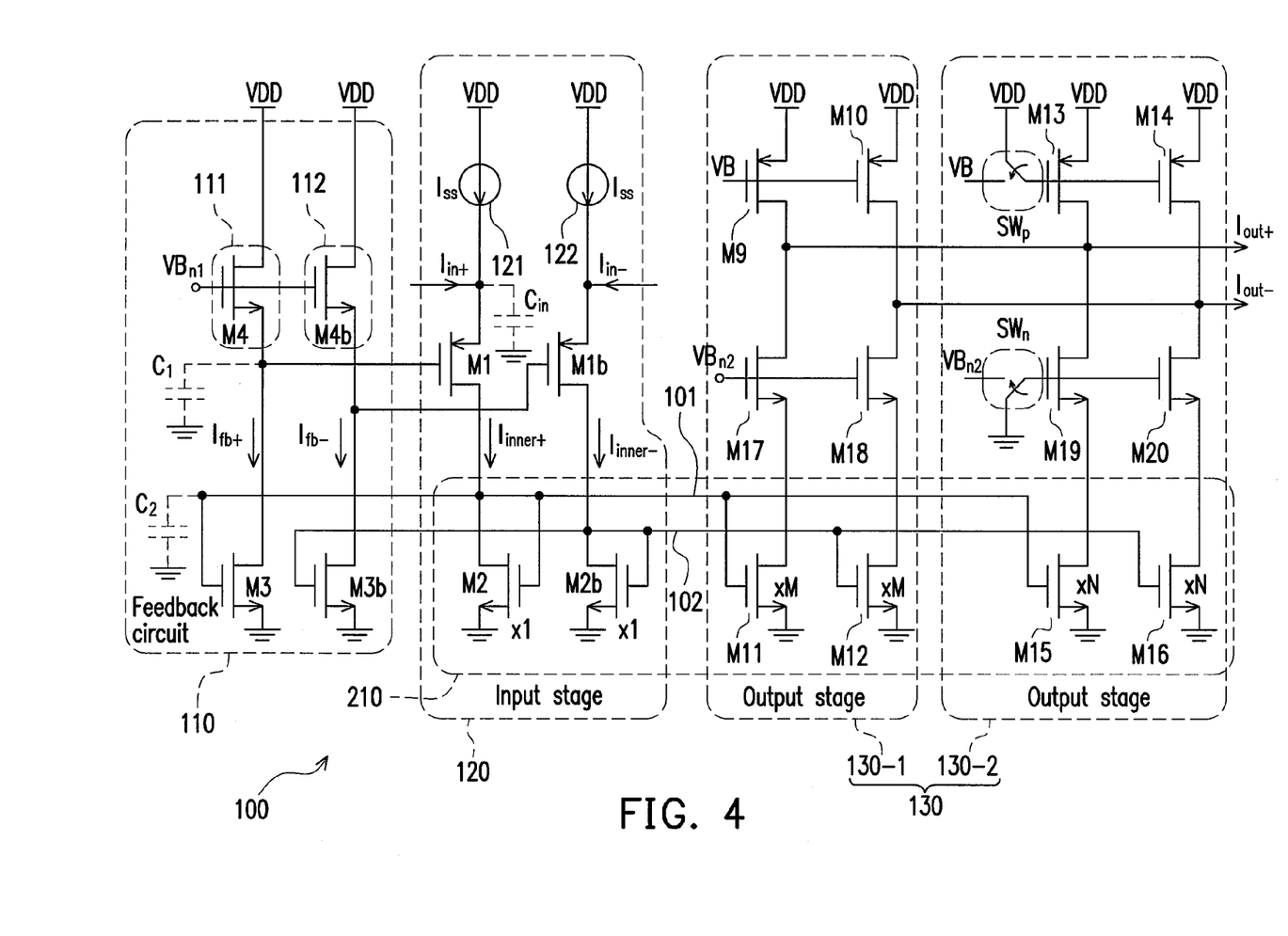
FIG. 4 is a circuit schematic diagram illustrating a current-mode amplifier of FIG. 1 according to another exemplary embodiment of the disclosure.

FIG. 4 is a circuit schematic diagram illustrating a current-mode amplifier according to another exemplary embodiment of the disclosure. The current-mode amplifier 100 of FIG. 4 is similar to the current-mode amplifier 100 of FIG. 2, and a difference there between is that the output stage 130 of FIG. 4 further includes a second switch SWn, a seventeenth transistor M17, an eighteenth transistor M18, a nineteenth transistor M19 and a twentieth transistor M20. In the present exemplary embodiment, the transistors M17, M18, M19 and M20 are NMOS transistors.

The first end of the ninth transistor M9 is connected to the first output terminal of the output stage 130 and a first end (for example, a drain) of the seventeenth transistor M17. The first end of the tenth transistor M10 is connected to the second output terminal of the output stage 130 and a first end (for example, a drain) of the eighteenth transistor M18. A second end (for example, a source) of the seventeenth transistor M17 is coupled to the first end of the eleventh transistor M11. A second end (for example, a source) of the eighteenth transistor M18 is connected to the first end of the twelfth transistor M12. Control ends (for example, gates) of the transistors M17 and M18 receive the second bias $VB_{n2}$. The second bias $VB_{n2}$ can be a band-gap reference voltage or other fixed voltages.

The first end of the thirteenth transistor M13 is connected to the first output terminal of the output stage 130 and a first end (for example, a drain) of the nineteenth transistor M19. The first end of the fourteenth transistor M14 is connected to the second output terminal of the output stage 130 and a first end (for example, a drain) of the twentieth transistor M20. A second end (for example, a source) of the nineteenth transistor M19 is coupled to the first end of the fifteenth transistor M15. A second end (for example, a source) of the twentieth transistor M20 is connected to the first end of the sixteenth transistor M16. The second bias $VB_{n2}$ or the second reference voltage (for example, the ground voltage) is selected and transmitted to the control ends (the gates) of the transistors M19 and M20 through the second switch SWn.

When the first bias VB is selected and transmitted to the control ends of the transistors M13 and M14 through the first switch SWp, and the second bias $VB_{n2}$ is selected and transmitted to the control ends (the gates) of the transistors M19 and M20 through the second switch SWn, the circuit structure of the gain circuit 130-2 is similar to that of the gain circuit 130-1. Now, the gain circuits 130-1 and 130-2 commonly provide the first output current $I_{out+}$ and the second output current $I_{out-}$, namely, the current-mode amplifier 100 has a relatively great output gain.

When the power voltage VDD is selected and transmitted to the control ends of the transistors M13 and M14 through the first switch SWp, and the ground voltage is selected and transmitted to the control ends of the transistors M19 and M20 through the second switch SWn, the transistors M13, M14, M19 and M20 are turned off, so as to ensure that the disabled gain circuit 130-2 does not influence the output currents $I_{out+}$ and $I_{out-}$ of the current-mode amplifier 100. Now, the first output current $I_{out+}$ and the second output current $I_{out-}$ are provided by the gain circuit 130-1 alone, namely, the current-mode amplifier 100 has a relatively small output gain.

In summary, based on a local feedback mode of the feedback circuit 110, a low impedance input stage is implemented by the transistors M1, M2, M1b and M2b. The inner currents $I_{inner+}$ and $I_{inner-}$ of the input stage 120 are respectively transmitted (mirrored) to a plurality of gain circuits of the output stage 130 by a predetermined multiplication factor by using the current structure 210. By enabling/disabling the gain circuits, a tunable current gain stage of the output stage 130 is implemented. An input impedance $Z_{in}$ of the current-mode amplifier 100 of FIG. 4 in an s-domain can be represented as a following equation (1):

$$Z_{in} = \frac{1}{g_{m1}} \cdot \frac{s^2 C_1 C_2 + s(C_1 g_{m2} + C_2 g_{m4}) + (g_{m4} \cdot g_{m2} - g_{m1} \cdot g_{m3})}{s^3 \frac{C_1 \cdot C_2 \cdot C_{in}}{g_{m1}} + s^2 \left[ C_1 C_2 + \frac{C_{in}}{g_{m1}} (C_1 g_{m2} + C_2 g_{m4}) \right] + s \left[ C_1 g_{m2} + C_2 g_{m4} + \frac{C_{in}}{g_{m1}} (g_{m4} g_{m2} - g_{m1} g_{m3}) \right] + g_{m4} \cdot g_{m2}}$$

equation (1)

Wherein, $g_{m1}$, $g_{m2}$, $g_{m3}$ and $g_{m4}$ respectively represent conductances of the transistors M1, M2, M3 and M4. $C_{in}$ represents a parasitic capacitance of the first input terminal of the input stage 120. A parasitic capacitance $C_1 = C_{gs4} + C_{ds4} + C_{ds3}$, wherein $C_{gs4}$ represents a parasitic capacitance from the gate to the source of the transistor M4, $C_{ds4}$ represents a parasitic capacitance from the drain to the source of the transistor M4, and $C_{ds3}$ represents a parasitic capacitance from the drain to the source of the transistor M3. A parasitic capacitance $C_2 = C_{gs2} + C_{ds2} + C_{gs3}$, wherein $C_{gs2}$ represents a parasitic capacitance from the gate to the source of the transistor M2, $C_{ds2}$ represents a parasitic capacitance from the drain to the source of the transistor M2, and $C_{gs3}$ represents a parasitic capacitance from the gate to the source of the transistor M3. In case of a low frequency, the equation (1) can be simplified as:

$$Z_{in,DC} = \frac{1}{g_{m1}} \cdot \left(1 - \frac{g_{m1}}{g_{m4}} \cdot \frac{g_{m3}}{g_{m2}}\right) \quad \text{equation (2)}$$

Therefore, the input impedance can be reduced through the feedback circuit 110, so as to achieve the purpose of broadband.

Figure 5:
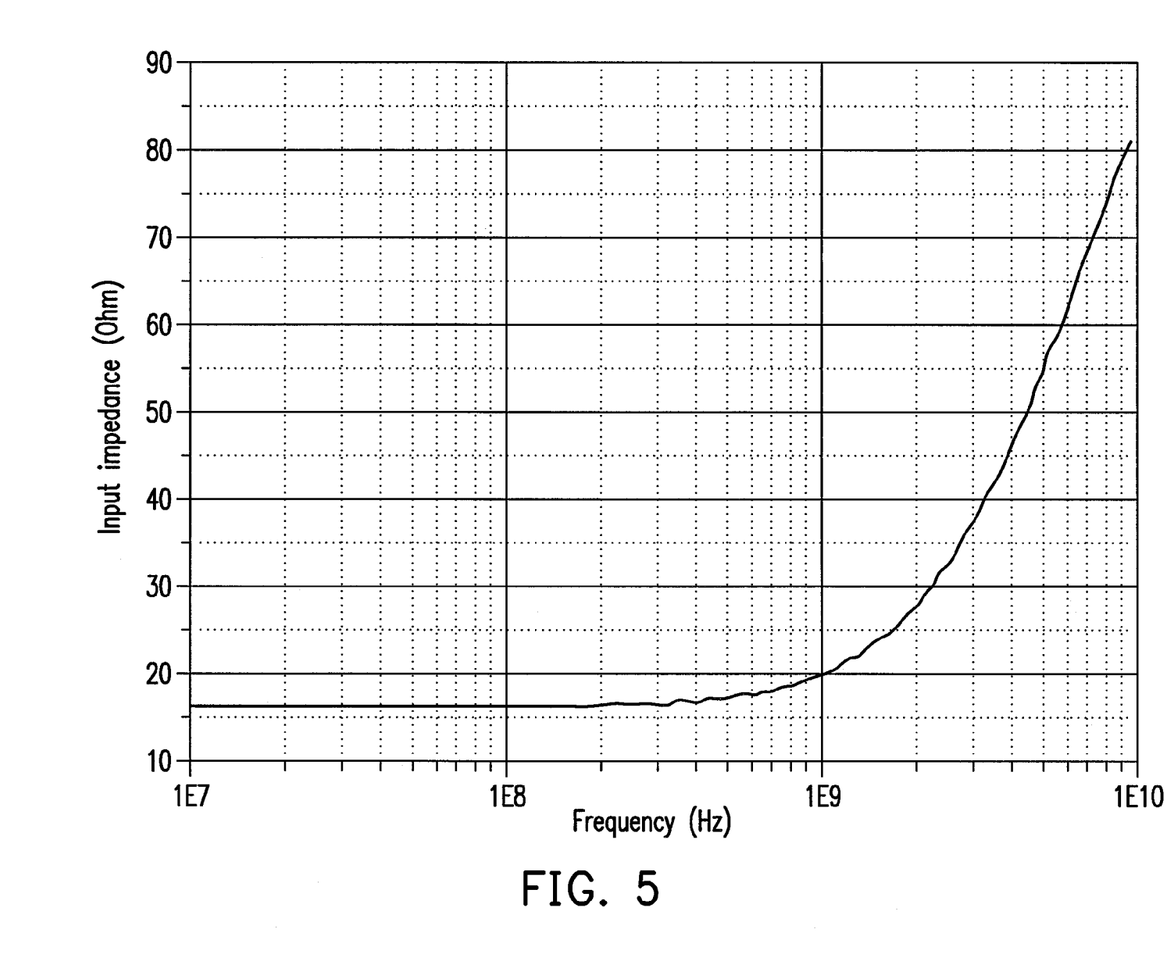
FIG. 5 is a diagram illustrating a simulation result of an input impedance of a feedback circuit of FIG. 4.
Figure 6:
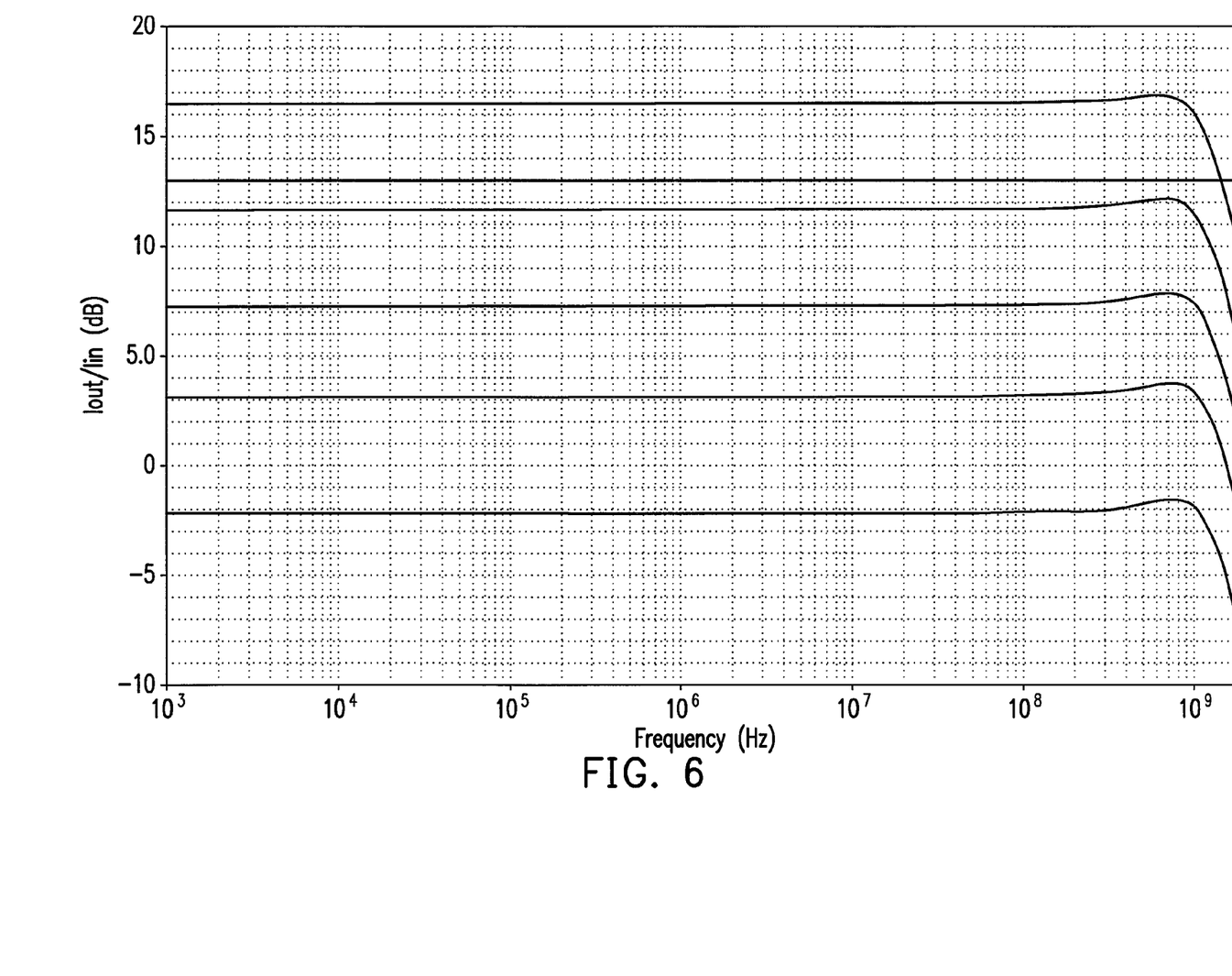
FIG. 6 is a gain frequency response diagram of a current-mode amplifier of FIG. 4.

FIG. 5 is a diagram illustrating a simulation result of the input impedance of the feedback circuit 110 of FIG. 4. According to FIG. 5, it is known that an input bandwidth of the feedback circuit 110 may reach 1 GHz. FIG. 6 is a gain frequency response diagram of the current-mode amplifier 100 of FIG. 4. A vertical axis of FIG. 6 represents gains, i.e. ratios of the output current $I_{out}$ and the input current $I_{in}$. According to FIG. 6, it is known that under different gain modulations, the current-mode amplifier 100 may still maintain the bandwidth of 1 GHz.

Figure 7:
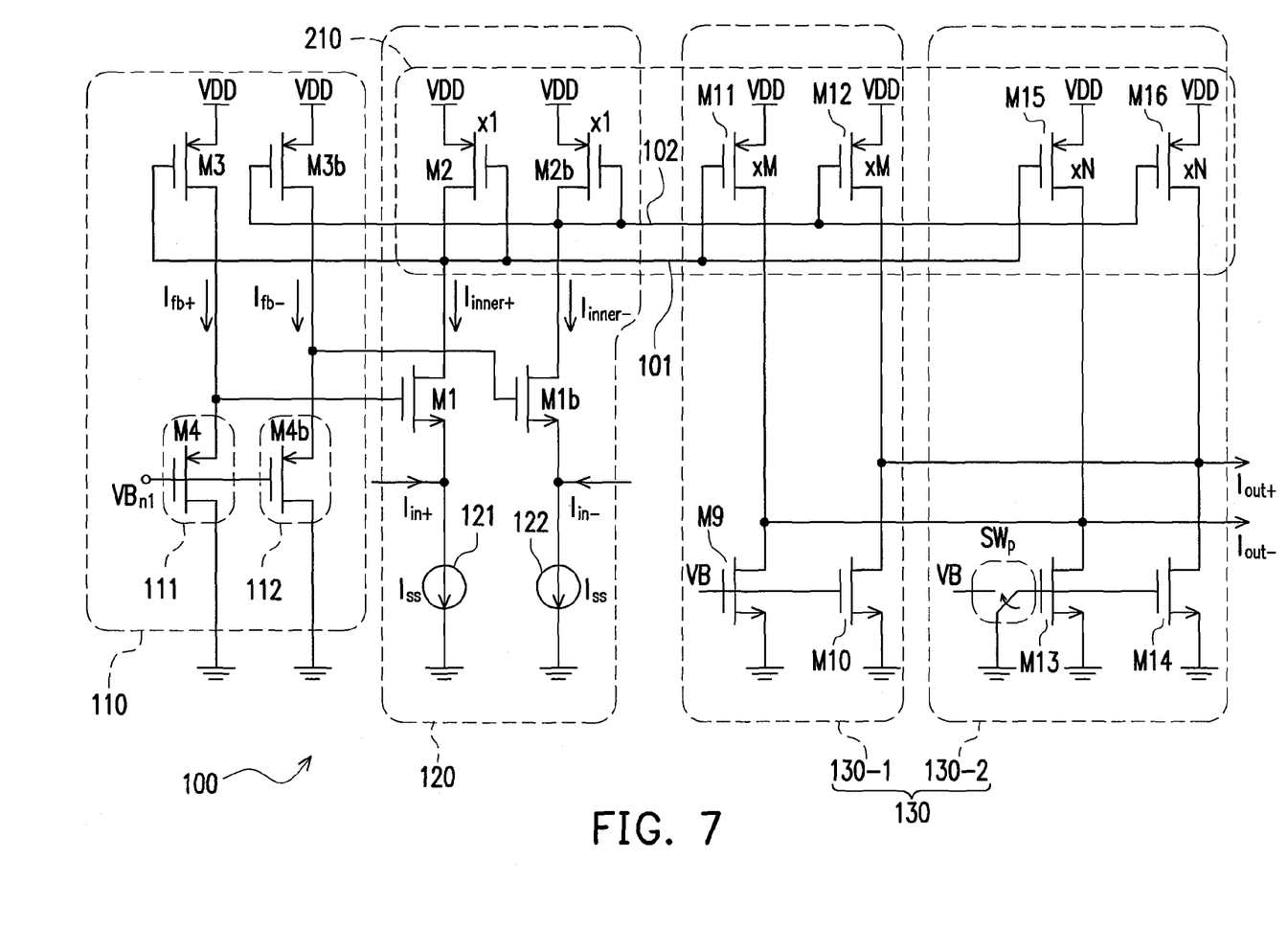
FIG. 7 is a circuit schematic diagram illustrating a current-mode amplifier 100 of FIG. 1 according to still another exemplary embodiment of the disclosure.

FIG. 7 is a circuit schematic diagram illustrating the current-mode amplifier 100 of FIG. 1 according to still another exemplary embodiment of the disclosure. The current-mode amplifier 100 of FIG. 7 is similar to the current-mode amplifier 100 of FIG. 2, and a difference there between is that the transistors M2, M2b, M3, M3b, M11, M12, M15 and M16 of FIG. 7 are PMOS transistors, and the transistors M1, M1b, M4, M4b, M9, M10, M13 and M14 of FIG. 7 are NMOS transistors. In the present embodiment, the first reference voltage connected to the transistors M1, M1b, M3, M4b, M9, M10, M13, M14 and the switch SWp is the ground voltage, and the second reference voltage connected to the transistors M2, M2b, M3, M3b, M11, M12, M15 and M16 is the power voltage VDD.

Figure 8:
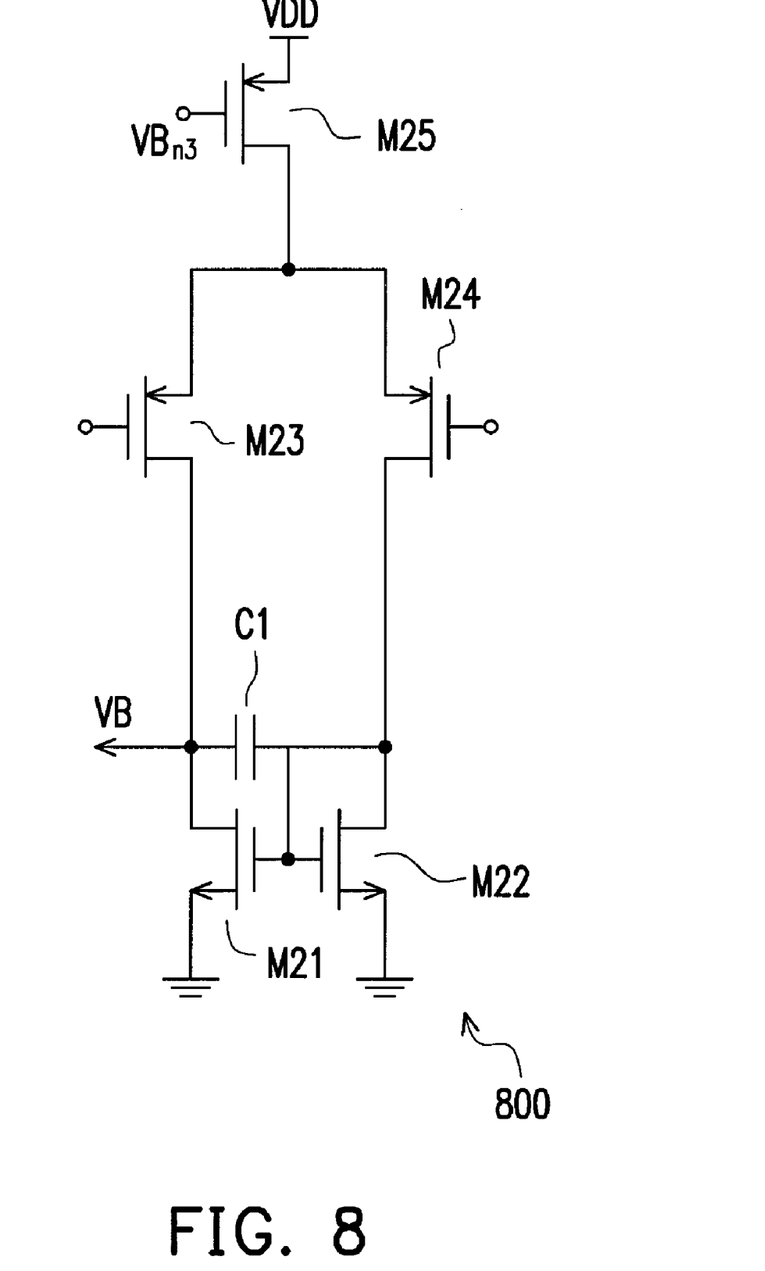
FIG. 8 is a circuit schematic diagram illustrating a common-mode feedback amplifier according to another exemplary embodiment of the disclosure.

FIG. 8 is a circuit schematic diagram illustrating a common-mode feedback amplifier 800 according to another exemplary embodiment of the disclosure. The common-mode feedback amplifier 800 of FIG. 8 is similar to the common-mode feedback amplifier 300 of FIG. 3, and a difference there between is that transistors M23, M24 and M25 of the common-mode feedback amplifier 800 are PMOS transistors, and transistors M21 and M22 of the common-mode feedback amplifier 800 are NMOS transistors. In the present exemplary embodiment, the first reference voltage connected to the transistors M21 and M22 is the ground voltage, and the second reference voltage connected to the transistor M25 is the power voltage VDD. The common-mode feedback amplifier 800 may generate the first bias VB to the output stage 130 of FIG. 7.

Figure 9:
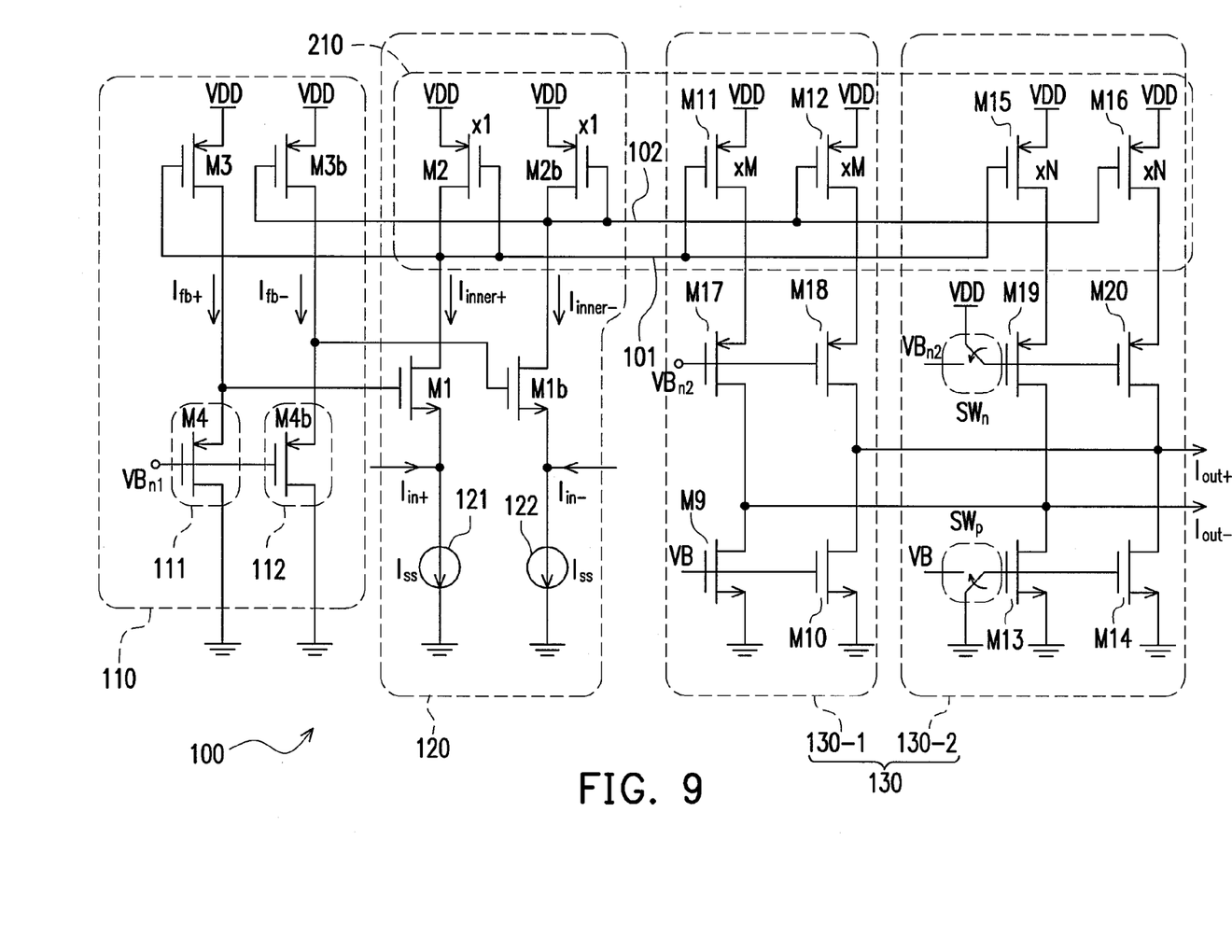
FIG. 9 is a circuit schematic diagram illustrating a current-mode amplifier of FIG. 1 according to yet another exemplary embodiment of the disclosure.

FIG. 9 is a circuit schematic diagram illustrating the current-mode amplifier 100 of FIG. 1 according to yet another exemplary embodiment of the disclosure. The current-mode amplifier 100 of FIG. 9 is similar to the current-mode amplifiers 100 of FIG. 4 and FIG. 7.

In summary, the disclosure provides a variable gain amplifier, which can be applied to a UWB wireless transceiver system. Signals within a baseband range (0-250 MHz) are amplified according to a broadband property of the current-mode amplifier 100, so as to overcome a limitation that a voltage-mode amplifier cannot be operated over 100 MHz. Moreover, a gain control of the current-mode amplifier 100 is achieved by controlling a current mirror, so that a problem of a gain error influenced by fabrication variation can be resolved. An applicable bandwidth of the current-mode amplifier 100 can be more than 1 GHz, which can be very competitive in a future ultra-wideband application.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A current-mode amplifier, comprising:
an input stage, having an input terminal for receiving an input current of the current-mode amplifier, wherein the input stage generates an inner current according to the input current and a feedback current, and the input terminal of the input stage comprises a first input terminal and a second input terminal, an output terminal of the input stage comprises a first output terminal and a second output terminal, and the input stage comprises:
a first current source;
a second current source;
a first transistor, having a first end connected to a first end of the first current source and the first input terminal of the input stage, and a control end being controlled by the feedback circuit;
a second transistor, having a first end connected to a first end of the second current source and the second input terminal of the input stage, and a control end being controlled by the feedback circuit;
a third transistor, having a first end connected to a second end of the first transistor, and a control end connected to the first end of the third transistor, wherein a common node of the third transistor and the first transistor is connected to the first output terminal of the input stage; and
a fourth transistor, having a first end connected to a second end of the second transistor, and a control end connected to the first end of the fourth transistor, wherein a common node of the fourth transistor and the second transistor is connected to the second output terminal of the input stage;
an output stage, having an input terminal connected to the output terminal of the input stage, and an output terminal serving as an output terminal of the current-mode amplifier; and
a feedback circuit, having an input and an output terminals connected to the input stage, for generating the feedback current according to the inner current of the input stage.
2. The current-mode amplifier as claimed in claim 1, wherein the inner current is a sum of the input current and the feedback current.
3. The current-mode amplifier as claimed in claim 1, wherein the first transistor and the second transistor are P-channel metal oxide semiconductor (PMOS) transistors, and the third transistor and the fourth transistor are N-channel metal oxide semiconductor (NMOS) transistors.
4. The current-mode amplifier as claimed in claim 1, wherein the first transistor and the second transistor are NMOS transistors, and the third transistor and the fourth transistor are PMOS transistors.
5. The current-mode amplifier as claimed in claim 1, wherein second ends of the first current source and the second current source are connected to a first reference voltage, and second ends of the third transistor and the fourth transistor are connected to a second reference voltage.
6. The current-mode amplifier as claimed in claim 1, wherein the feedback circuit comprises:
a first impedance, having a first end connected to a first reference voltage, and a second end connected to the control end of the first transistor;

a second impedance, having a first end connected to the first reference voltage, and a second end connected to the control end of the second transistor;

a fifth transistor, having a first end connected to the second end of the first impedance, a second end connected to a second reference voltage, and a control end connected to the first end of the third transistor; and a sixth transistor, having a first end connected to the second end of the second impedance, a second end connected to the second reference voltage, and a control end connected to the first end of the fourth transistor.

7. The current-mode amplifier as claimed in claim 6, wherein the first impedance comprises a seventh transistor, and the second impedance comprises an eighth transistor.

8. The current-mode amplifier as claimed in claim 7, wherein the fifth, the sixth, the seventh and the eighth transistors are NMOS transistors.

9. The current-mode amplifier as claimed in claim 7, wherein the fifth, the sixth, the seventh and the eighth transistors are PMOS transistors.

10. The current-mode amplifier as claimed in claim 1, wherein the input terminal of the output stage comprises a first input terminal and a second input terminal, the output terminal of the output stage comprises a first output terminal and a second output terminal, and the output stage comprises:

a fifth transistor, having a first end connected to the first output terminal of the output stage, and a control end receiving a first bias;

a sixth transistor, having a first end connected to the second output terminal of the output stage, and a control end receiving the first bias;

a seventh transistor, having a first end connected to the first end of the fifth transistor, and a control end connected to the first input terminal of the output stage; and an eighth transistor, having a first end connected to the first end of the sixth transistor, and a control end connected to the second input terminal of the output stage.

11. The current-mode amplifier as claimed in claim 10, wherein the output stage further comprises:

a ninth transistor, having a first end connected to the first output terminal of the output stage;

a tenth transistor, having a first end connected to the second output terminal of the output stage;

a first switch, selecting to transmit the first bias or a first reference voltage to control ends of the ninth transistor and the tenth transistor;

an eleventh transistor, having a first end connected to the first end of the ninth transistor, and a control end connected to the first input terminal of the output stage; and a twelfth transistor, having a first end connected to the first end of the tenth transistor, and a control end connected to the second input terminal of the output stage.

12. The current-mode amplifier as claimed in claim 11, wherein the fifth, the sixth, the ninth and the tenth transistors are PMOS transistors, and the seventh, the eighth, the eleventh and the twelfth transistors are NMOS transistors.

13. The current-mode amplifier as claimed in claim 11, wherein the fifth, the sixth, the ninth and the tenth transistors are NMOS transistors, and the seventh, the eighth, the eleventh and the twelfth transistors are PMOS transistors.

14. The current-mode amplifier as claimed in claim 11, wherein second ends of the fifth, the sixth, the ninth and the tenth transistors are connected to the first reference voltage, and second ends of the seventh, the eighth, the eleventh and the twelfth transistors are connected to a second reference voltage.

15. The current-mode amplifier as claimed in claim 1, wherein the input terminal of the output stage comprises a first input terminal and a second input terminal, the output terminal of the output stage comprises a first output terminal and a second output terminal, and the output stage comprises:

a fifth transistor, having a first end connected to the first output terminal of the output stage, and a control end receiving a first bias;

a sixth transistor, having a first end connected to the second output terminal of the output stage, and a control end receiving the first bias;

a seventh transistor, having a control end connected to the first input terminal of the output stage;

an eighth transistor, having a control end connected to the second input terminal of the output stage;

a ninth transistor, having a first end connected to the first end of the fifth transistor, a second end connected to a first end of the seventh transistor, and a control end receiving a second bias; and a tenth transistor, having a first end connected to the first end of the sixth transistor, a second end connected to a first end of the eighth transistor, and a control end receiving the second bias.

16. The current-mode amplifier as claimed in claim 15, wherein the output stage further comprises:

an eleventh transistor, having a first end connected to the first output terminal of the output stage;

a twelfth transistor, having a first end connected to the second output terminal of the output stage;

a first switch, selecting to transmit the first bias or a first reference voltage to control ends of the thirteenth transistor and the fourteenth transistor;

a thirteenth transistor, having a control end connected to the first input terminal of the output stage;

a fourteenth transistor, having a control end connected to the second input terminal of the output stage;

a fifteenth transistor, having a first end connected to the first end of the eleventh transistor, and a second end connected to a first end of the thirteenth transistor;

a sixteenth transistor, having a first end connected to the first end of the twelfth transistor, and a second end connected to a first end of the fourteenth transistor; and a second switch, selecting to transmit the second bias or a second reference voltage to control ends of the fifteenth transistor and the sixteenth transistor.

17. The current-mode amplifier as claimed in claim 16, wherein the fifth, the sixth, the eleventh and the twelfth transistors are PMOS transistors, and the seventh, the eighth, the thirteenth, the fourteenth, the ninth, the tenth, the fifteenth and the sixteenth transistors are NMOS transistors.

18. The current-mode amplifier as claimed in claim 16, wherein the fifth, the sixth, the eleventh and the twelfth transistors are NMOS transistors, and the seventh, the eighth, the thirteenth, the fourteenth, the ninth, the tenth, the fifteenth and the sixteenth transistors are PMOS transistors.

19. The current-mode amplifier as claimed in claim 16, wherein second ends of the fifth, the sixth, the eleventh and the twelfth transistors are connected to the first reference voltage, and second ends of the seventh, the eighth, the thirteenth and the fourteenth are connected to the second reference voltage.

* * * * *